United States Patent
Zhao et al.

(10) Patent No.: US 8,345,394 B2
(45) Date of Patent: Jan. 1, 2013

(54) ESD PROTECTION CIRCUIT FOR A SWITCHING POWER CONVERTER

(75) Inventors: James W. Zhao, San Francisco, CA (US); Reed W. Adams, Mountain View, CA (US); Kenji Tomiyoshi, Mihama-Ku Chiba (JP); Bin Shao, Shanghai (CN); Atsushi Matamura, Tokyo (JP); Yogesh Sharma, Santa Clara, CA (US); Todd Thomas, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 722 days.

(21) Appl. No.: 12/573,501

(22) Filed: Oct. 5, 2009

(65) Prior Publication Data

US 2011/0080678 A1  Apr. 7, 2011

(51) Int. Cl.
*H02H 9/00* (2006.01)
(52) U.S. Cl. .......................................... 361/56
(58) Field of Classification Search ................ 361/56
See application file for complete search history.

(56) References Cited

U.S. PATENT DOCUMENTS

| | | | |
|---|---|---|---|
| 6,369,994 B1 * | 4/2002 | Voldman | 361/56 |
| 7,236,339 B2 * | 6/2007 | Miller et al. | 361/56 |
| 7,538,999 B2 * | 5/2009 | Watanabe | 361/56 |
| 2008/0024169 A1 * | 1/2008 | Ng | 326/83 |
| 2008/0049365 A1 * | 2/2008 | Worley et al. | 361/56 |
| 2008/0123228 A1 * | 5/2008 | Hung | 361/56 |
| 2011/0080678 A1 * | 4/2011 | Zhao et al. | 361/56 |

* cited by examiner

*Primary Examiner* — Ronald W Leja
(74) *Attorney, Agent, or Firm* — Koppel, Patrick, Heybl & Philpott

(57) ABSTRACT

An ESD protection circuit for a switching power converter which includes a high-side switching element connected between a supply voltage and the switching node, and a low-side switching element connected between the switching node and a common node. A current conduction path couples an ESD event that occurs on the switching node to an ESD sense node, and an ESD sensing circuit coupled to the sense node generates a trigger signal when an ESD event is sensed. A first logic gate keeps the high-side switching element off when the trigger signal indicates the sensing of an ESD event, and a second logic gate causes the low-side switching element to turn on when an ESD event is sensed such that the low-side switching element provides a conductive discharge path between the switching node and common node.

26 Claims, 5 Drawing Sheets

ESD PROTECTION CIRCUIT FOR A SWITCHING POWER CONVERTER

BACKGROUND OF THE INVENTION

1. Field of the Invention

This invention relates to the field of ESD protection circuits for switching power converters.

2. Description of the Related Art

Common to all switching power converters is a switching element which, when driven to turn on, conducts a current to a "switching" node (SW). For several common configurations, a high-side switching element is connected between a voltage source (power supply) and the SW node, and a low-side switching element is connected between the SW node and circuit common or ground; during normal operation, the high- and low-side switching elements are alternately turned on and off as needed to charge and discharge an output inductor and capacitor and thereby provide a regulated output voltage.

All electronic circuits are susceptible to electro-static discharge (ESD) which can damage the circuit's components; this includes the switching elements of a switching power converter. This is particularly true when the low-side switching element is an n-channel MOSFET (NMOS FET), and as such, measures are often taken to protect the NMOS FET from being damaged by ESD. One way in which the NMOS FET can be protected from ESD is to design it with a larger-than-normal Drain-Contact-to-Gate-Spacing (DCGS). While this method works well for NMOS FETs having a channel width of a few thousands μm or less, it becomes impractical for switching power converters that utilize NMOS FETs having much greater channel widths—e.g., >10,000 μm. In this case, increasing the DCGS would require increasing the silicon die size to an economically uncompetitive level, and the FET's drain-source on-resistance ($R_{dson}$) would become unacceptably high.

With a large NMOS FET, "active" ESD protection—i.e., circuitry which detects ESD events and triggers an appropriate protective response—is often employed. One common method is to use an active ESD protection circuit to force the NMOS FET to turn on, so that an ESD discharge path is provided between the SW node and ground by the NMOS FET's channel. However, making such a circuit stable and reliable can be a daunting task, for several reasons.

Such circuitry is typically connected directly to the SW node, to enable an ESD event to be detected; this arrangement is referred to as 'direct sensing'. When a very large NMOS FET is forced to turn on by the active ESD circuit, the SW node will be pulled to ground potential nearly instantaneously, since the NMOS FET's $R_{dson}$ is usually on the order of milliohms. This results in the ESD circuit losing its power, which causes the NMOS FET to turn off. However, if the ESD event has not finished when this occurs, the remainder of the ESD charge will force the voltage on the SW node to shoot up again, which triggers another cycle as described above. Also, if the active ESD circuit does not respond quickly enough, or does not retrigger following a previous trigger event for some reason, the NMOS FET can still be damaged. This results in unreliable ESD protection or unstable oscillatory behavior.

A direct sensing arrangement can also cause the ESD protection circuit to falsely trigger during normal operation. This can occur because very fast and very large switching spikes—comparable to those associated with ESD events—are constantly present on the SW node.

As noted above, a common protective method is to force the NMOS FET to turn on. This is typically achieved by having the ESD protection circuit generate an active-high 'trigger signal' when an ESD event is detected, which is directly applied to the gate of the NMOS FET; this arrangement is referred to as 'direct coupling'. When so arranged, the ESD trigger signal and the control signal which operates the NMOS FET under normal operating conditions will physically share the same node. However, during an ESD event, the state of the normal operations signal is unknown, and it is possible that the two signals will conflict and render the ESD protection unreliable.

Another problem can occur if the low-side switching element is turned on to provide a conductive path between the SW node and ground during an ESD event, without regard to the status of the high-side switching element. If the high-side switching element happens to be on while the low-side switching element is on, a 'shoot-through' condition occurs which can cause severe damage to the switching elements of the power converter, especially when false triggering occurs during normal operations.

SUMMARY OF THE INVENTION

An ESD protection circuit for a switching power converter is presented which overcomes the problems noted above.

The present protection circuit is suitable for use with a switching power converter which includes a high-side switching element connected between a voltage source (power supply) node and the switching node, and a low-side switching element connected between the switching node and a common node (ground). The circuit includes an ESD sense node—preferably the converter's power supply node—and a current conduction path which couples an ESD event that occurs on the switching node to the ESD sense node. When the high-side switching element is a PMOS FET, the conduction path can be provided, for example, by the body diode of the PMOS transistor. Alternatively, if the high-side switching element does not inherently provide such a conduction path, a dedicated device such as a PMOS FET, an isolated NMOS FET or a forward diode connected between the SW node and the ESD sense node can be used.

The ESD protection circuit also includes an ESD sensing circuit, coupled to the ESD sense node and arranged to generate an output signal when an ESD event is sensed on the ESD sense node. The protection circuit employs a logic gate, which is arranged to keep the high-side switching element off when the output of the ESD sensing circuit indicates that an ESD event has been detected, and another logic gate to cause the low-side switching element to turn on when an ESD event is sensed such that the low-side switching element provides a conductive discharge path between the switching node and common node.

Further features and advantages of the invention will be apparent to those skilled in the art from the following detailed description, taken together with the accompanying drawings.

DETAILED DESCRIPTION OF THE INVENTION

Figure 1A:
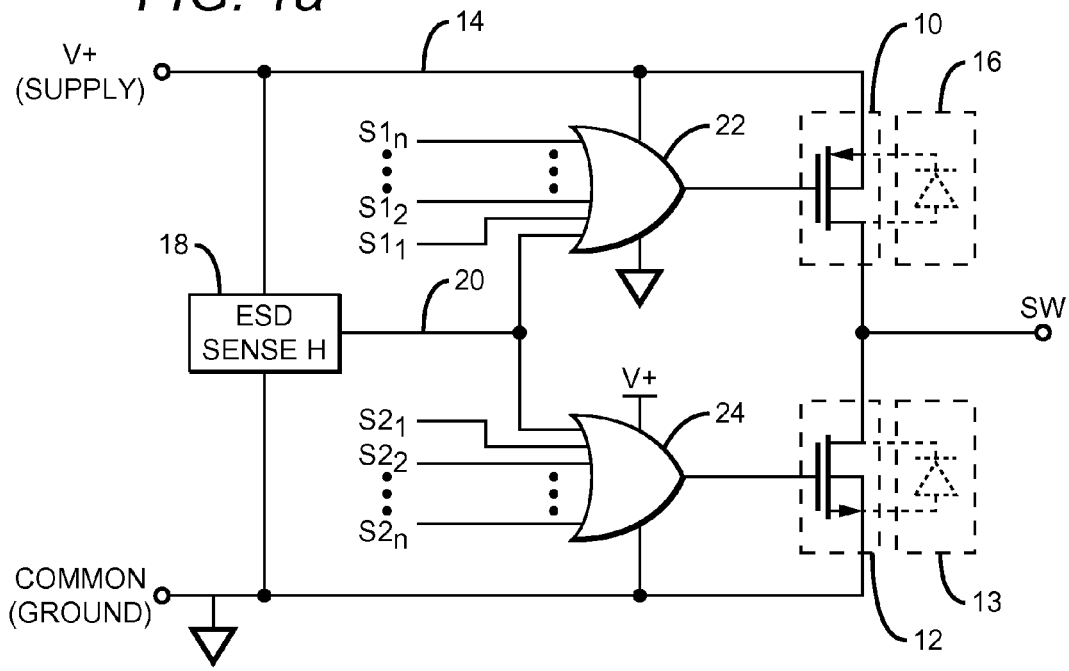
FIG. 1a is a schematic diagram illustrating an embodiment of an ESD protection circuit per the present invention, which employs an active-high trigger signal when an ESD event is sensed.
Figure 1B:
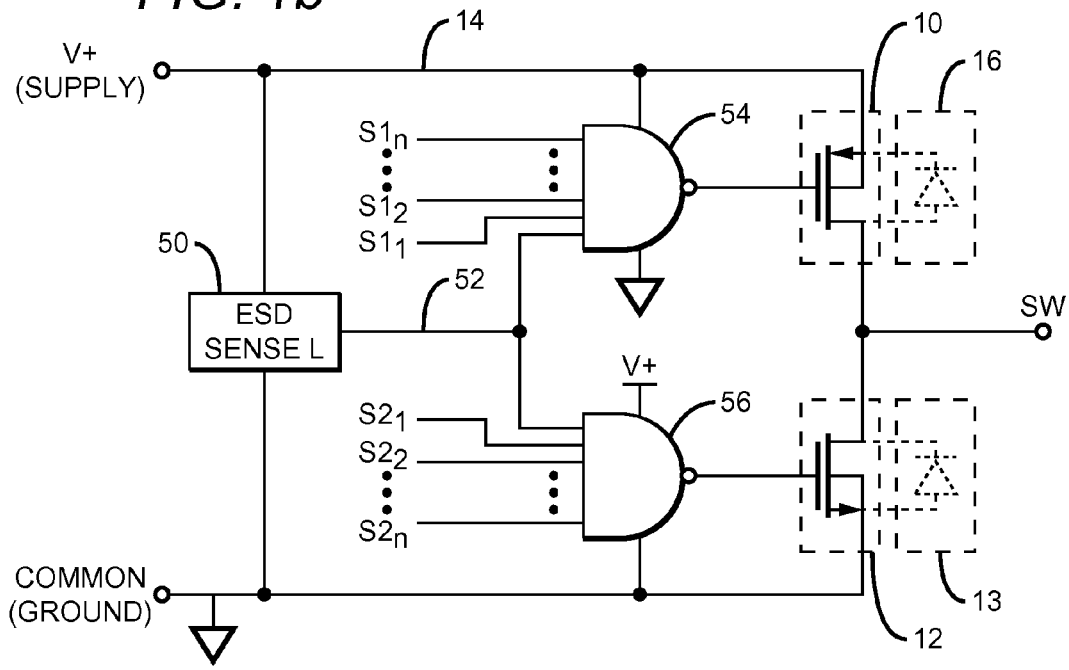
FIG. 1b is a schematic diagram illustrating another embodiment of an ESD protection circuit per the present invention, which employs an active-low trigger signal when an ESD event is sensed.

Schematic diagrams illustrating the basic principles of an ESD protection circuit per the present invention are shown in FIGS. 1a and 1b. The present circuit is suitable for protecting the low-side switching element of a switching power converter from ESD damage. Converters for which the circuit can be used have a high-side switching element 10 connected between a voltage source node V+ and switching node SW, and a low-side switching element 12 connected between the SW node and a common node (shown in FIGS. 1a and 1b as ground, but which can also be a fixed non-zero potential).

Note that a complete switching power converter would include a number of elements not shown in FIGS. 1a and 1b for simplicity, including but not limited to an output inductor and capacitor, and a control circuit which generates control signals ($S1_1, S1_2 \ldots, S1_n$ and $S2_1, S2_2 \ldots, S2_n$, shown) to operate switching elements 10 and 12 as needed for the converter to provide a regulated output voltage during normal operation (i.e., in the absence of an ESD event). There are many different switching power converter architectures and control schemes; the present invention is applicable to any configuration which utilizes a PMOS FET or PNP transistor as the high-side switching element connected between a supply voltage and a switching node and which uses an NMOS FET or NPN transistor as the low-side switching element connected between the switching node and a common node.

The present ESD protection circuit requires an ESD sense node 14 which is different from the SW node, and a current conduction path 16 which couples an ESD event that occurs on the SW node to the ESD sense node. An ESD sensing circuit 18 is coupled to the ESD sense node and arranged to generate a trigger signal of finite duration when an ESD event is sensed on the ESD sense node; the trigger signal is inactive during normal operation. For the example shown in FIG. 1a, the trigger signal 20 is an 'active-high' signal, meaning that it goes high when an ESD event is sensed and is low when inactive; in FIG. 1b, the trigger signal 52 is an active-low signal, which is high when inactive.

In FIG. 1a, a first logic gate 22 is arranged to keep high-side switching element 10 off when trigger signal 20 goes high to indicate the sensing of an ESD event, and a second logic gate 24 is arranged to cause low-side switching element 12 to turn on when trigger signal 20 (or a signal derived from trigger signal 20) indicates the sensing of an ESD event, such that low-side switching element 12 provides a conductive discharge path between the SW node and common node. Similarly, in FIG. 1b, a first logic gate 54 is arranged to keep high-side switching element 10 off when trigger signal 52 (or a signal derived from trigger signal 52) goes low to indicate the sensing of an ESD event, and a second logic gate 56 is arranged to cause low-side switching element 12 to turn on when trigger signal 52 indicates the sensing of an ESD event, such that low-side switching element 12 provides a conductive discharge path between the SW node and common node.

FIG. 1a illustrates a generalized implementation scheme for an active-high trigger signal 20, in which logic gates 22 and 24 are m-input OR gates (where m=n+1 and n= 1, 2, 3 . . . ). Logic gate 22 receives trigger signal 20 and normal operation control signals $S1_1, S1_2 \ldots, S1_n$ at respective inputs, and logic gate 24 receives trigger signal 20 and control signals $S2_1, S2_2 \ldots, S2_n$ at respective inputs. In practice, each of gates 22 and 24 can be an actual m-input OR gate or a Boolean equivalent. Gate 22 is arranged such that its output goes high and turns off high-side switching element 10 when trigger signal 20 indicates the sensing of an ESD event; when trigger signal 20 is inactive, gate 22 allows normal operation control signals $S1_1, S1_2 \ldots, S1_n$ to propagate to high-side switching element 10 without alteration—i.e., without affecting the polarity of the control signals. Similarly, gate 24 is arranged such that its output goes high and turns on low-side switching element 12 when trigger signal 20 indicates the sensing of an ESD event; when trigger signal 20 is inactive, gate 24 allows normal operation control signals $S2_1, S2_2 \ldots, S2_n$ to propagate without alteration to low-side switching element 12.

FIG. 1b illustrates a generalized implementation scheme for an active-low trigger signal 52, in which logic gates 54 and 56 are m-input NAND gates (where m=n+1 and n= 1, 2, 3 . . . ). Here, logic gate 54 receives trigger signal 52 and normal operation control signals $S1_1, S1_2 \ldots, S1_n$ at respective inputs and logic gate 56 receives trigger signal 52 and control signals $S2_1, S2_2 \ldots, S2_n$ at respective inputs. In practice, each of gates 54 and 56 can be an actual m-input NAND gate or a Boolean equivalent. Gate 54 is arranged such that its output goes high and turns off high-side switching element 10 when trigger signal 52 indicates the sensing of an ESD event; when trigger signal 52 is inactive, gate 54 allows normal operation control signals $S1_1, S1_2 \ldots, S1_n$ to propagate without alteration to high-side switching element 10. Similarly, gate 56 is arranged such that its output goes high and turns on low-side switching element 12 when trigger signal 52 indicates the sensing of an ESD event; when trigger signal 52 is inactive, gate 56 allows normal operation control signals $S2_1, S2_2 \ldots, S2_n$ to propagate without alteration to low-side switching element 12.

Providing an ESD sense node 14 which is different from the SW node, and coupling the ESD sensing circuit to that node to detect ESD events, is referred to herein as 'indirect sensing'. This arrangement serves to avoid the problems associated with the 'direct sensing' approach described above.

The ESD sense node is preferably the power supply that is associated with the SW node—i.e., supply voltage node V+—as shown in FIG. 1a and FIG. 1b. When an ESD event strikes the SW node, the supply voltage node is pulled up quickly via current conduction path 16. For this reason, coupling the ESD sensing circuit to this node enables ESD events to be detected as effectively as if the sensing circuit were connected directly to the SW node. Using the supply voltage node as the ESD sense node provides additional benefits that a "direct sensing" scheme cannot match. For example, during an ESD event, when high-side switching element 10 is turned off by the ESD sensing circuit, the supply node voltage will be held steady by its relatively large node capacitance to continuously supply power to the ESD sensing circuits and the logic gates to keep high-side switching element 10 off and low-side switching element 12 on until the entire ESD event is over. In addition, coupling the sensing circuit to the supply node serves to substantially reduce the possibility of false triggering of the active ESD circuit during normal operation, because the switching noise on the power supply is much lower than that present on the SW node itself, due to heavy external filtering of the power supply. Note that false ESD triggering is an unwanted system disruption which may have serious consequences, and as such is to be avoided.

Switching elements 10 and 12 can be implemented with, for example, PNP and NPN bipolar transistors or, as shown in FIGS. 1a and 1b, with a PMOS and NMOS FET, respectively. When switching elements 10 and 12 are FETs, the current conduction path 16 which couples an ESD event that occurs on the SW node to the ESD sense node can be the inherent body diode present between the drain and body of the PMOS FET. Alternatively, a dedicated device such as a diode, bipolar transistor, MOSFET or JFET might be used to provide the current conduction path.

The use of logic gates 22, 24 and 54, 56 enables the ESD trigger signal to be indirectly coupled to the switching elements; this approach is referred to herein as 'indirect coupling'. In FIG. 1a, each OR gate receives the trigger signal 20 from ESD sensing circuit 18 at one input, and the control signals ($S1_1$, $S1_2$ ..., $S1_n$ or $S2_1$, $S2_2$ ..., $S2_n$) for its respective switching element at its other inputs. Similarly, in FIG. 1b, each NAND gate receives the trigger signal 52 from ESD sensing circuit 18 at one input, and the control signals ($S1_1$, $S1_2$ ..., $S1_n$ or $S2_1$, $S2_2$ ..., $S2_n$) for its respective switching element at its other inputs. Thus, instead of directly combining the ESD trigger signal and normal operation control signals as described above, the logic gate is used to combine the trigger and control signals while keeping them independent, to avoid potential conflict between the signals and thereby providing predictable and reliable ESD triggering. This arrangement also serves to avoid adversely loading the normal control signals with the trigger signal that can occur when direct coupling is employed.

The gates and control signals are arranged such that, when trigger signal 20, 52 indicates the sensing of an ESD event, logic gate 22, 54 respectively keeps switching element 10 off and logic gate 24, 56 respectively causes switching element 12 to turn on and thereby provide a conductive discharge path between the SW and common nodes. The gates and control signals must also be arranged such that the control signals operate switching elements 10 and 12 in normal fashion under normal operating conditions.

Keeping switching element 10 off while switching element 12 is forced on during an ESD event provides an "anti-shoot-through" mechanism A "shoot-through" condition occurs when the high-side and low-side switching elements are both turned on, which results in supply node 14 being shorted to ground. Should shoot-through occur during normal switching operations, catastrophic consequences to the switching elements are usually the end result. Adding the anti-shoot-through mechanism serves two purposes: first, it protects the switching elements from damage due to a false ESD trigger that occurs during normal switching operations, although the chance of such an occurrence is remote when the present ESD protection circuit is implemented. Second, it prevents the supply node from being dragged down to ground during the ESD event, thereby enabling the supply node voltage to stay steady and continue to provide power to the ESD protection circuit to maintain its operation.

Figure 2:
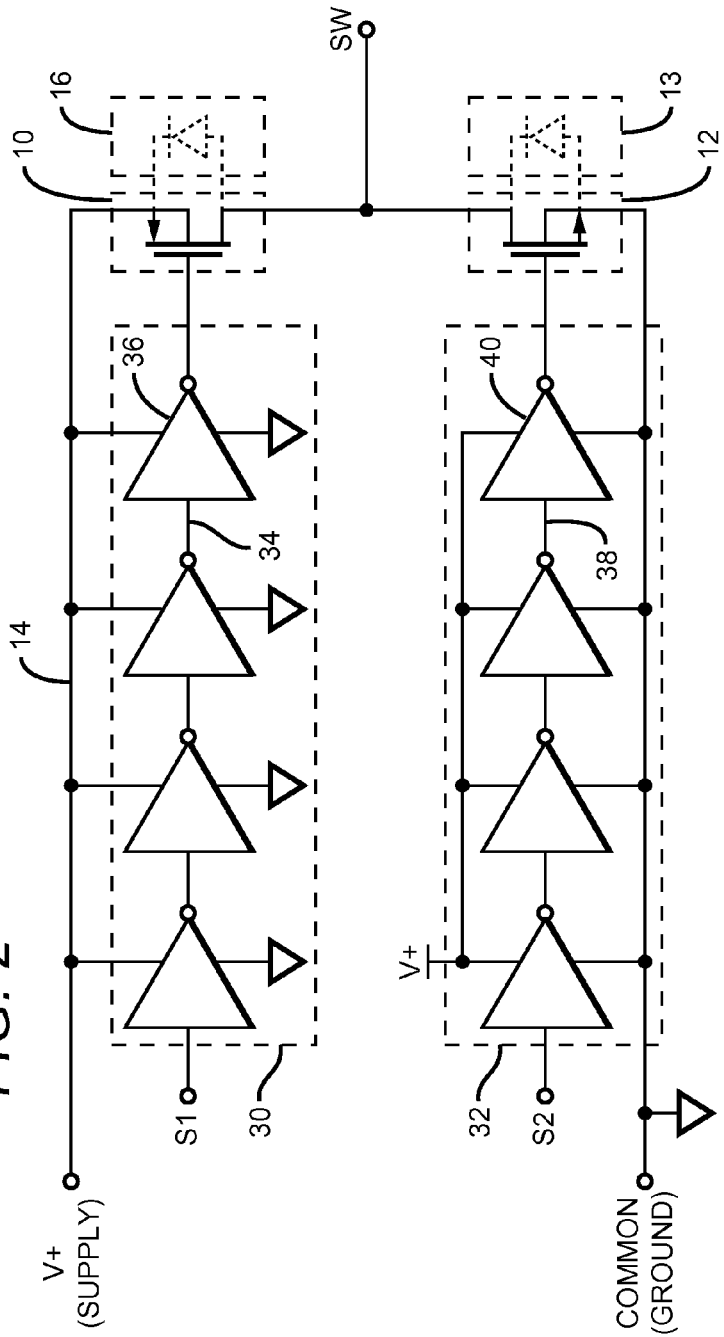
FIG. 2 is a schematic diagram of a portion of a switching power converter which employs pre-driver circuits.

The present ESD protection circuit is particularly well-suited for use with switching power converters that employ respective pre-driver circuits to drive the high-side and low-side switching elements; FIG. 2 is a schematic showing exemplary pre-driver circuits (30 and 32) without the present ESD protection circuit. The pre-driver circuits each comprises an inverter or more typically, as shown in FIG. 2, a chain of inverters connected in series, with the inverters typically becoming progressively larger from the beginning to the end of the chain. The pre-driver operates to propagate a control signal (S1, S2) during normal switching operations to the high- and low-side switching elements.

Figure 3:
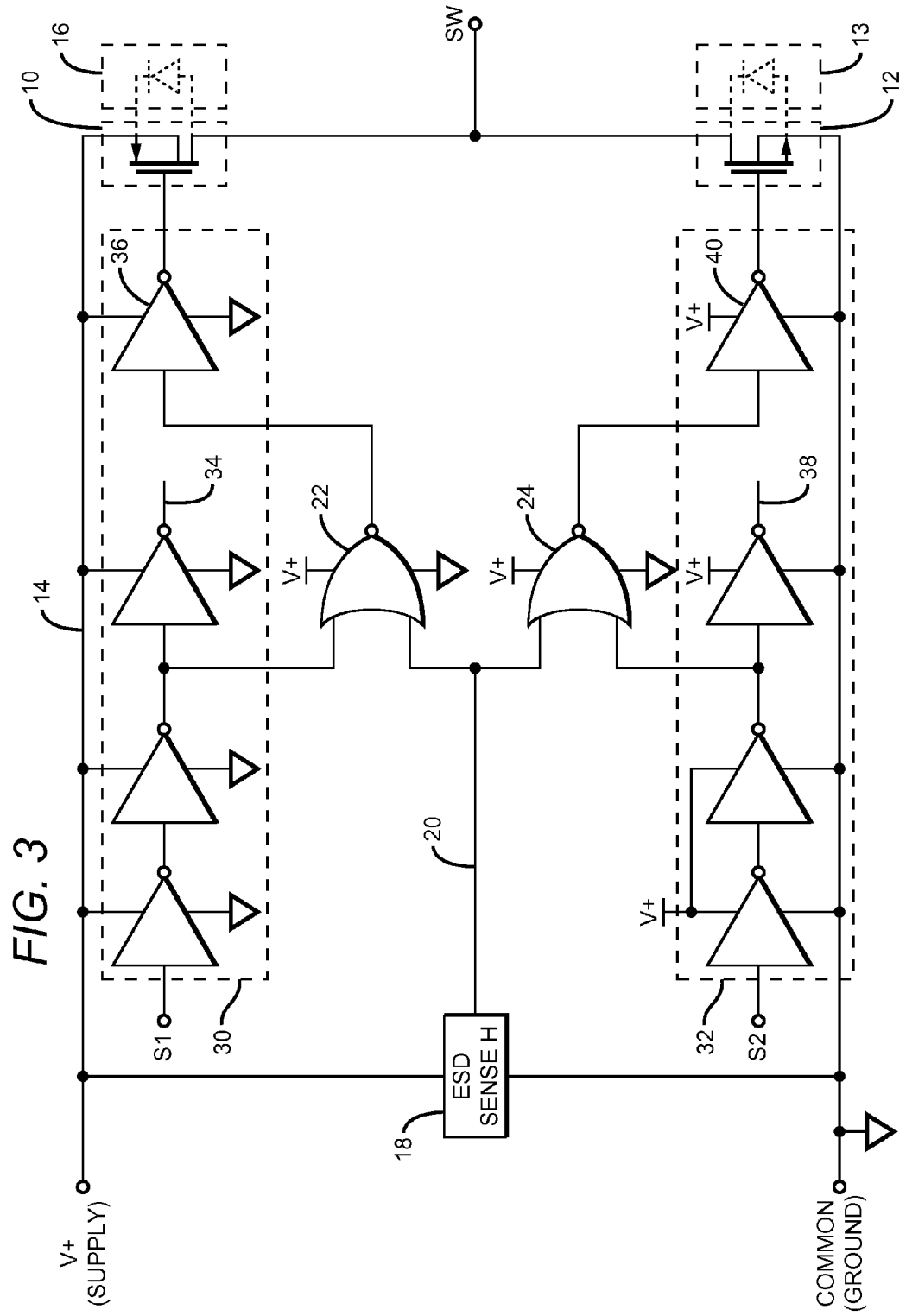
FIG. 3 is a schematic diagram illustrating an embodiment of an ESD protection circuit per the present invention which employs an active-high trigger signal when an ESD event is sensed, as might be used with a switching power converter which employs pre-driver circuits.

FIG. 3 illustrates an implementation of the present ESD protection circuit in the circuit shown in FIG. 2. Here, one of the inverters of pre-driver circuit 30 is replaced with NOR gate 22 or its Boolean equivalent, and one of the inverters of pre-driver circuit 32 is replaced with NOR gate 24 or its Boolean equivalent. The function of NOR gate 22 is to keep the high-side switching element off during an ESD event, while the function of NOR gate 24 is to force the low-side switching element to turn on during an ESD event; during normal operation, gates 22 and 24 allow the control signals (S1, S2) to propagate down the pre-driver chain to the switching elements without alteration.

The pre-drivers might be designed to include the NOR logic gates in the desired locations, or existing pre-drivers might be modified as needed to incorporate the NOR logic gates. FIG. 3 illustrates the use of modified pre-driver circuits: in circuit 30, the inverter output 34 that would normally be connected to the input of inverter 36 is cut, thereby enabling the output of logic gate 22 to be connected to the input of inverter 36. Similarly, for pre-driver circuit 32, the inverter output 38 that would normally be connected to the input of inverter 40 is cut, thereby enabling the output of logic gate 24 to be connected to the input of inverter 40.

In general, when the ESD sensing circuit produces an active-high trigger signal when an ESD event is detected, the NOR logic gate which combines the ESD trigger signal and normal pre-driver signal should be located at stage 2N+1 of the pre-driver chain, where N=0, 1, 2, 3 ... with the stage nearest the switching element being stage 0. Thus, in FIG. 2, N=0 and 2N+1=1, and therefore NOR gates 22 and 24 are located at stage 1 of the pre-driver chain. Proper operation would be maintained if the NOR gates were located at, for example, stage 3 (N=1 and 2N+1=3). However, it is preferred that the logic gates be inserted in the pre-driver chain as close to the switching elements as possible, to minimize the propagation delay for the ESD sensing circuit trigger signal and thereby obtain the fastest possible response to an ESD event.

The sequence of events that occurs when an ESD event strikes the SW node of the circuit in FIG. 3 is as follows:

when an ESD event strikes on the SW node, conduction path 16 conveys the event to the V+ node (14).

the fast rise of V+ causes the ESD sensing circuit 18 coupled to V+ to generate its active-high trigger signal 20 for a finite duration, after which the trigger signal returns to logic-low such that the ESD sensing circuit has no negative effect on the switching converter during normal operations.

the trigger signal going high forces the output of NOR gates 22 and 24 to go low, which propagates down the pre-driver chain and arrives at switching elements 10 and 12 as a logic high, thereby pulling up the gates of both the high-side and low-side FETs connected to SW node.

as a result, the high-side PMOS FET is turned off while the low-side NMOS FET is turned on. This enables the ESD event to be discharged via the NMOS FET, while shoot-through is avoided by keeping the PMOS FET off. This sequence of events will be carried out as long as ESD sensing circuit 18 outputs a logic-high trigger signal when ESD strikes on the SW node, regardless of the logic states of S1 and S2.

Figure 4:
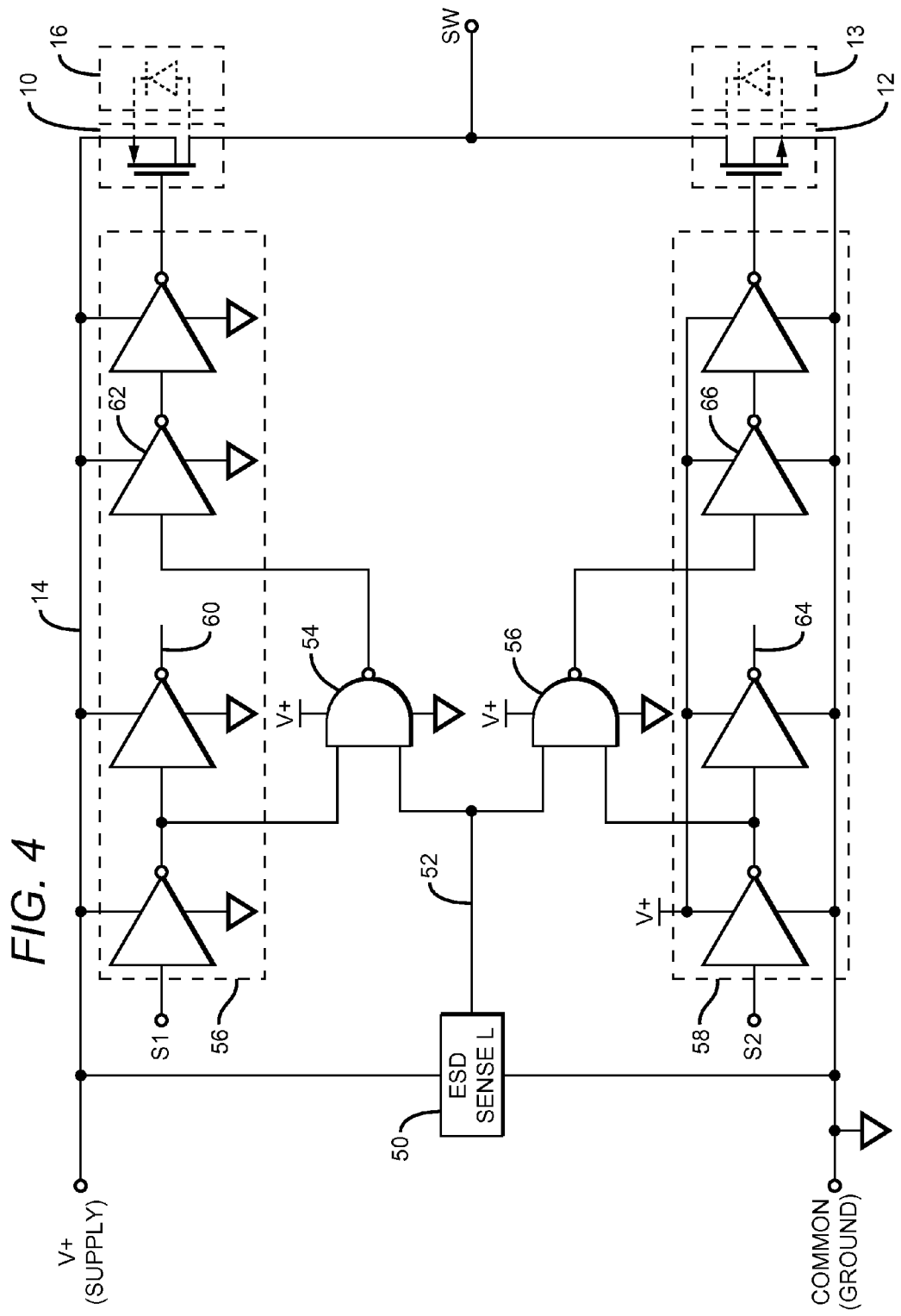
FIG. 4 is a schematic diagram illustrating an embodiment of an ESD protection circuit per the present invention which employs an active-low trigger signal when an ESD event is sensed, as might be used with a switching power converter which employs pre-driver circuits.

An implementation that includes pre-driver circuits and which is suitable for use with an active-low trigger signal is shown in FIG. 4. Pre-driver circuits 56 and 58, each comprising a plurality of inverters connected in series, drive high-side and low-side switching elements 10 and 12, respectively. To implement the ESD protection circuit, one of the inverters of pre-driver circuit 56 is replaced with logic gate 54, and one of the inverters of pre-driver circuit 58 is replaced with logic gate 56. The locations are selected to provide the desired operability: i.e., such that NAND gate 54 or its Boolean equivalent causes switching element 10 to be kept off, and such that NAND gate 56 or its Boolean equivalent forces switching element 12 to turn on when ESD trigger signal 52 goes low during an ESD event. During normal operation, gates 54 and 56 allow the control signals (S1, S2) to propagate down the pre-driver chain to the switching elements without alteration. Here, the inverter output 60 that would normally be connected to the input of the inverter 62 in pre-driver circuit 56 is cut, thereby enabling the output of NAND gate 54 to be connected to the input of inverter 62. Similarly, for pre-driver circuit 58, the inverter output 64 that would normally be connected to the input of the inverter 66 is cut, thereby enabling the output of NAND gate 56 to be connected to the input of inverter 66.

In general, when the ESD sensing circuit produces an active-low trigger signal when an ESD event is detected, the NAND gate which combines the ESD trigger signal and normal pre-driver signal should be located at stage 2N of the pre-driver chain, where N=0, 1, 2, 3 . . . . Thus, in FIG. 4, N=1 and 2N=2, and therefore NAND gates 54 and 56 are located at stage 2 of the pre-driver chain. Proper operation would be maintained if the NAND gate were located at, for example, stage 0 (N=2N=0).

The sequence events that occurs when an ESD event strikes the SW node of the circuit in FIG. 4 is similar to that described above in relation to FIG. 3, except that here, trigger signal 52 going low forces the output of NAND gates 54 and 56 to go high, which propagates down the pre-driver chain and arrives at switching elements 10 and 12 as a logic high, thereby pulling up the gates of both the high-side and low-side FETs connected to SW node. This sequence of events will be carried out as long as the ESD sensing circuit (50) outputs a logic-low trigger signal (52) when ESD strikes on the SW node, regardless of the logic states of S1 and S2.

Note that the embodiments shown in FIGS. 1a-4 are merely exemplary. The present ESD protection circuit can be adapted for use with many different switching power converter configurations, employing different switching element types and control signal polarities, and with or without pre-driver circuits. It is only essential that the ESD protection circuit employ an ESD sensing circuit and logic gates so as to provide indirect sensing and indirect coupling as described above.

Figure 5:
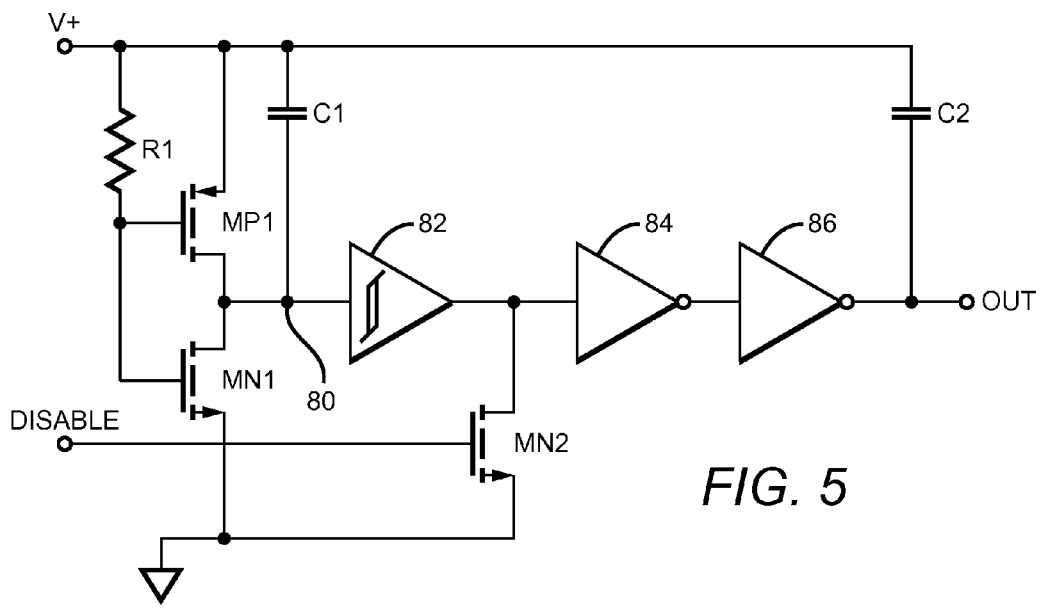
FIG. 5 is a schematic diagram illustrating one possible embodiment of an active-high ESD sensing circuit per the present invention.

The ESD sensing circuits can be implemented in many different ways. One possible embodiment, based on a design described in U.S. Pat. No. 5,838,146 to Singer and arranged to generate an active-high trigger signal of fixed duration, is shown in FIG. 5. A capacitance C1 is connected between the ESD sense node (supply voltage node V+ in this example) and a node 80. A buffer 82, preferably with a Schmitt trigger input, relays the signal on node 80 to two inverter stages 84, 86, which propagate the signal to an output OUT. A fast rise on the V+ node causes capacitance C1 to pull up the voltage at the input of amplifier 82; when the voltage exceeds a pre-determined threshold, the buffer output causes an active-high trigger signal to be produced at OUT. FETs MP1 and MN1 form an inverter, the output of which is also connected to node 80 and serves to discharge C1, with the duration of the active-high trigger signal determined by the RC time constant created by capacitance C1 and the resistance of MN1. Resistance R1 serves to establish an RC delay before MP1 turns off and MN1 turns on to discharge C1; R1 also provides ESD protection to the gates of MP1 and MN1. A capacitance C2 can be added between V+ and OUT to improve the response time of the ESD sensing circuit. C1 and C2 are preferably implemented with respective FETs, due to their small size and ready availability.

During normal operation, the ESD sensing circuit can be disabled by applying a logic 'high' on the 'disable' node; this turns on a FET MN2, which pulls down on the input to the inverters and keeps OUT low, thereby preventing false triggering.

Figure 6:
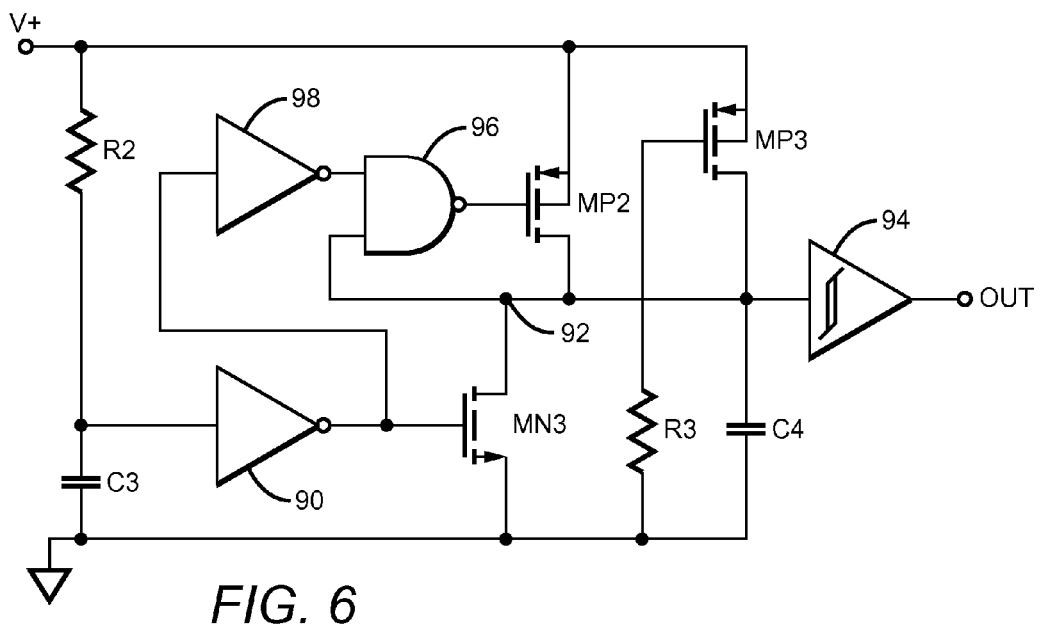
FIG. 6 is a schematic diagram illustrating another possible embodiment of an active-low ESD sensing circuit per the present invention.

Another possible embodiment, arranged to generate an active-low trigger signal, is shown in FIG. 6. A resistance R2 and capacitance C3 are connected in series between the ESD sense node (supply voltage node V+ in this example) and circuit common. An inverter 90 connected to the R2/C3 junction drives an NMOS FET MN3; when the voltage at the inverter input exceeds a pre-determined threshold, MN3 turn on and pulls down on a node 92. Node 92 is buffered by a buffer 94, preferably with a Schmitt trigger input, to produce the circuit's output OUT. Before an ESD event, C3 is discharged via R2 (the switching power converter being protected is at greatest risk while being handled, at which time V+ is zero).

A PMOS FET MP2 is connected to pull up on node 92 when on. MP2 is driven with a NAND gate 96 connected at one input to node 92 and at its other input to the output of an inverter 98 which is driven by the output of inverter 90.

When an ESD event strikes the SW node, the V+ node rises rapidly, but C3 holds the input of inverter 90 low for a short time. During this time, the output of inverter 90 is high and turns on MN3, pulling down node 92 and causing OUT to go low. While the output of inverter 90 is high, the output of NAND gate 96 will be high and MP2 will be off.

After a short period, R2 charges C3 enough to cause the output of inverter 90 to go low, causing MN3 to turn off. Node 92 is still low at this point, causing NAND gate 96 to keep MP2 off. This allows a PMOS FET MP3 connected between V+ and node 92 to begin charging a capacitance C4 connected between node 92 and circuit common. When the voltage on C4 is sufficiently high, the output of NAND gate 96 goes low and MP2 is turned on, forcing node 92 and OUT to a high state, in which it is locked to prevent false triggering. The duration of the active-low signal is determined by the RC time constant of C4 and the on-resistance of MP2. A resistor R3 may be included to provide ESD protection for the gate of MP3.

Note that the ESD sensing circuits shown in FIGS. 5 and 6 are merely exemplary; there are numerous designs that could be used to detect an ESD event and generate an active-high or active-low trigger signal.

While particular embodiments of the invention have been shown and described, numerous variations and alternate embodiments will occur to those skilled in the art. Accordingly, it is intended that the invention be limited only in terms of the appended claims.

We claim:

1. An electro-static discharge (ESD) protection circuit for the switching node (SW) of a switching power converter which includes a high-side switching element connected between a supply voltage node and said SW node and a low-side switching element connected between said SW node and a common node, comprising:
- an ESD sense node which is different from said SW node;
- a current conduction path which couples an ESD event that occurs on said SW node to said ESD sense node;
- an ESD sensing circuit coupled to said ESD sense node and arranged to generate a trigger signal when an ESD event is sensed on said ESD sense node;
- a first logic gate arranged to keep said high-side switching element off when said trigger signal indicates that an ESD event is sensed; and
- a second logic gate arranged to cause said low-side switching element to turn on when said trigger signal indicates that an ESD event is sensed such that said low-side switching element provides a conductive discharge path between said SW node and said common node.

2. The ESD protection circuit of claim 1, wherein said high-side and low-side switching elements are a PMOS FET and an NMOS FET, respectively.

3. The ESD protection circuit of claim 1, wherein said ESD sense node is said supply voltage node.

4. The ESD protection circuit of claim 3, wherein said high-side and low-side switching elements are a PMOS FET and an NMOS FET, respectively, and said current conduction path is a diode connected between the drain and source of said PMOS FET.

5. The ESD protection circuit of claim 4, wherein said diode is the inherent body diode connected between the drain and body of said PMOS FET.

6. The ESD protection circuit of claim 1, wherein said first logic gate is arranged to receive a first signal derived from said trigger signal at a first input and at least one additional signal with indicates when said high-side switching element is to be turned on or off during normal operation of said switching power converter at respective additional inputs, said first logic gate further arranged to produce an output which causes said high-side switching element to be off when said first signal indicates that said trigger signal indicates the sensing of an ESD event and to allow the signals received at said first logic gate's additional inputs to propagate without alteration to said high-side switching element when said trigger signal is inactive; and
   wherein said second logic gate is arranged to receive said first signal at a first input and at least one additional signal with indicates when said low-side switching element is to be turned on or off during normal operation of said switching power converter at respective additional inputs, said second logic gate further arranged to produce an output which causes said low-side switching element to be on when said first signal indicates that said trigger signal indicates the sensing of an ESD event and to allow the signals received at said second logic gate's additional inputs to propagate without alteration to said low-side switching element when said trigger signal is inactive.

7. The ESD protection circuit of claim 6, wherein said trigger signal is an active-high signal and said first and second logic gates are OR gates or a Boolean equivalent.

8. The ESD protection circuit of claim 6, wherein said trigger signal is an active-low signal and said first and second logic gates are NAND gates or a Boolean equivalent.

9. The ESD protection circuit of claim 6, wherein said high-side and low-side switching elements are driven with the outputs of respective pre-driver circuits, each of which comprises an inverter or a chain of inverters connected in series, one of the inverters of said first pre-driver circuit replaced with said first logic gate such that said first logic gate causes said high-side switching element to be off when said first signal indicates that said trigger signal indicates the sensing of an ESD event and allows the signals received at said first logic gate's additional inputs to propagate without alteration to said high-side switching element when said trigger signal is inactive; and
   one of the inverters of said second pre-driver circuit replaced with said second logic gate such that said second logic gate causes said low-side switching element to be on when said trigger signal indicates the sensing of an ESD event and allows the signals received at said second logic gate's additional inputs to propagate without alteration to said low-side switching element when said trigger signal is inactive.

10. The ESD protection circuit of claim 9, wherein said trigger signal is an active-high signal and said first and second logic gates are NOR gates or a Boolean equivalent.

11. The ESD protection circuit of claim 9, wherein said trigger signal is an active-low signal and said first and second logic gates are NAND gates or a Boolean equivalent.

12. An electro-static discharge (ESD) protection circuit for the switching node (SW) of a switching power converter which includes a PMOS FET connected between a supply voltage node and said SW node and an NMOS FET connected between said SW node and a common node, comprising:
- a diode connected between the drain and source of said PMOS FET which couples an ESD event that occurs on said SW node to said supply voltage node;
- an ESD sensing circuit coupled to said supply voltage node and arranged to generate a trigger signal when an ESD event is sensed on said supply voltage node;
- first and second pre-driver circuits, the outputs of which drive said PMOS and NMOS FETs, respectively, each of said pre-driver circuits comprising an inverter or a chain of inverters connected in series;
- a first logic gate arranged to receive a first signal derived from said trigger signal at a first input and a second signal with indicates when said PMOS FET is to be turned on or off during normal operation of said switching power converter at a second input, one of the inverters of said first pre-driver circuit replaced with said first logic gate, said ESD protection circuit arranged such that said first logic gate causes said PMOS FET to be off when said first signal indicates that said trigger signal indicates the sensing of an ESD event and allows the signal received at said first logic gate's second input to propagate without alteration to said high-side switching element when said trigger signal is inactive; and
- a second logic gate arranged to receive said first signal at a first input and a second signal with indicates when said NMOS FET is to be turned on or off during normal operation of said switching power converter at a second input, one of the inverters of said second pre-driver circuit replaced with said second logic gate, said ESD protection circuit arranged such that said second logic gate causes said NMOS FET to be on when said first signal indicates that said trigger signal indicates the sensing of an ESD event such that said NMOS FET provides a conductive discharge path between said SW node and said common node and allows the signal received at said second logic gate's second input to propagate without alteration to said low-side switching element when said trigger signal is inactive.

13. The ESD protection circuit of claim 12, wherein said trigger signal is an active-high signal and said first and second logic gates are NOR gates or a Boolean equivalent.

14. The ESD protection circuit of claim 12, wherein said trigger signal is an active-low signal and said first and second logic gates are NAND gates or a Boolean equivalent.

15. The ESD protection circuit of claim 12, wherein said ESD sensing circuit comprises:
   an output node;
   a first capacitance connected between said ESD sense node and a second node;
   a buffer connected at its input to said second node and which produces an output which toggles when the voltage on said second node exceeds a pre-determined threshold, said output node coupled to the output of said buffer;
   first and second transistors arranged to form an inverter circuit which is coupled to said ESD sense node at its input and to said second node at its output, said inverter circuit arranged such that said second transistor is turned on and discharges the voltage on said second node a pre-determined amount of time after the output of said buffer amplifier has toggled, said pre-determined amount of time determined by the values of the resistance of said second transistor and said first capacitance.

16. The ESD protection circuit of claim 15, wherein said buffer has a Schmitt trigger input.

17. The ESD protection circuit of claim 15, further comprising one or more inverters connected between the output of said buffer and said output node.

18. The ESD protection circuit of claim 17, further comprising a second capacitance connected between said ESD sense node and said output node to improve the response speed of said output node.

19. The ESD protection circuit of claim 15, wherein said first capacitance is implemented with a FET.

20. The ESD protection circuit of claim 15, further comprising a disable transistor connected between said second node and common node such that, when turned on, said disable transistor pulls said output node low.

21. The ESD protection circuit of claim 15, wherein said ESD sensing circuit is arranged such that said output node toggles high when the voltage on said second node exceeds a pre-determined threshold.

22. The ESD protection circuit of claim 15, further comprising a resistance connected between the input of said inverter and said ESD sense node.

23. The ESD protection circuit of claim 12, wherein said ESD sensing circuit comprises:
   an output node;
   a resistance connected between said ESD sense node and a second node;
   a capacitance connected between said second node and said common node such that the voltage on said second node increases with the voltage on said ESD sense node;
   a first inverter connected at its input to said second node;
   a first transistor connected to the output of said first inverter such that it turns on and pulls down on a third node when the voltage on said second node is below a predetermined threshold and is turned off when the voltage on said second node is above said predetermined threshold;
   a buffer connected at its input to said third node and which produces an output which is coupled to said output node;
   a second transistor (MP3) connected between said ESD sense node and said third node and which is arranged to be on;
   a second capacitance connected between said third node and said common node such that it is charged by said second transistor; and
   circuitry arranged to sense the voltage on said third node and to pull up the voltage on said third node when said sensed voltage exceeds a second pre-determined threshold.

24. The ESD protection circuit of claim 23, wherein said buffer has a Schmitt trigger input.

25. The ESD protection circuit of claim 23, wherein said circuitry comprises:
   a second inverter which is driven by the output of said first inverter;
   a NAND gate connected to the output of said second inverter at a first input and to said third node at a second input;
   a transistor which is driven by the output of said NAND gate and pulls up the voltage on said third node when on.

26. The ESD protection circuit of claim 12, wherein said diode is the inherent body diode connected between the drain and body of said PMOS FET.

* * * * *

UNITED STATES PATENT AND TRADEMARK OFFICE
CERTIFICATE OF CORRECTION

PATENT NO.        : 8,345,394 B2
APPLICATION NO.   : 12/573501
DATED             : January 1, 2013
INVENTOR(S)       : James W. Zhao et al.

Page 1 of 1

It is certified that error appears in the above-identified patent and that said Letters Patent is hereby corrected as shown below:

In the Claims:
Column 9, Claim 6, Line 33, before "indicates" please delete "with" and replace with --which--
Column 9, Claim 6, Line 45, after "signal" please delete "with" and replace with --which--
Column 10, Claim 12, Line 39, after "signal" please delete "with" and replace with --which--
Column 10, Claim 12, Line 51, after "signal" please delete "with" and replace with --which--

Signed and Sealed this
Nineteenth Day of February, 2013

Teresa Stanek Rea
*Acting Director of the United States Patent and Trademark Office*